United States Patent
Onishi et al.

(10) Patent No.: US 9,527,943 B2
(45) Date of Patent: Dec. 27, 2016

(54) POLYMER, PHOTOSENSITIVE RESIN COMPOSITION AND ELECTRONIC DEVICE

(71) Applicants: SUMITOMO BAKELITE CO., LTD., Tokyo (JP); PROMERUS, LLC, Brecksville, OH (US)

(72) Inventors: Osamu Onishi, Shinagawa (JP); Haruo Ikeda, Shinagawa (JP); Larry F. Rhodes, Silver Lake, OH (US); Pramod Kandanarachchi, Brecksville, OH (US); Hugh Burgoon, Strongsville, OH (US)

(73) Assignees: SUMITOMO BAKELITE CO., LTD., Tokyo (JP); PROMERUS, LLC, Brecksville, OH (US)

( * ) Notice: Subject to any disclaimer, the term of this patent is extended or adjusted under 35 U.S.C. 154(b) by 0 days.

(21) Appl. No.: 14/640,405

(22) Filed: Mar. 6, 2015

(65) Prior Publication Data

US 2015/0252132 A1 Sep. 10, 2015

Related U.S. Application Data

(60) Provisional application No. 61/949,088, filed on Mar. 6, 2014.

(51) Int. Cl.
| | |
|---|---|
| *G03F 7/038* | (2006.01) |
| *C08F 222/40* | (2006.01) |
| *C08G 61/04* | (2006.01) |
| *C08G 61/08* | (2006.01) |

(52) U.S. Cl.
CPC ............ *C08F 222/40* (2013.01); *C08G 61/04* (2013.01); *C08G 61/08* (2013.01); *G03F 7/038* (2013.01)

(58) Field of Classification Search
CPC ..... C08F 2222/402; C08F 61/04; C08F 61/08; C08G 61/04; C08G 61/08; G03F 7/038
USPC .................... 526/262, 281; 430/270.1, 280.1
See application file for complete search history.

(56) References Cited

U.S. PATENT DOCUMENTS

| | | | | |
|---|---|---|---|---|
| 4,857,435 A * | 8/1989 | Hopf | ...................... | G03F 7/0233 430/165 |
| 5,843,624 A * | 12/1998 | Houlihan | .............. | G03F 7/0045 430/270.1 |
| 6,410,670 B1 * | 6/2002 | Lee | ........................ | C07C 69/753 430/192 |
| 2013/0072651 A1 * | 3/2013 | Yonemura | ............. | C08F 222/40 526/262 |

FOREIGN PATENT DOCUMENTS

JP 2-146045 A 6/1990

* cited by examiner

*Primary Examiner* — John S Chu
(74) *Attorney, Agent, or Firm* — Westerman, Hattori, Daniels & Adrian, LLP

(57) ABSTRACT

There is provided a polymer including a structural unit represented by the following Formula (1a), a structural unit represented by the following Formula (1b) and a structural unit represented by the following Formula (1c)

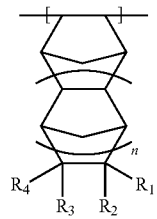

(1a)

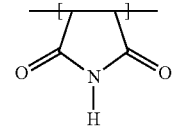

(1b)

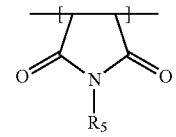

(1c)

(In Formula (1a), n represents 0, 1 or 2. Each of $R_1$, $R_2$, $R_3$ and $R_4$ independently represents a hydrogen atom or an organic group having 1 to 10 carbon atoms. In Formula (1c), $R_5$ represents an organic group having 1 to 10 carbon atoms.

9 Claims, 1 Drawing Sheet

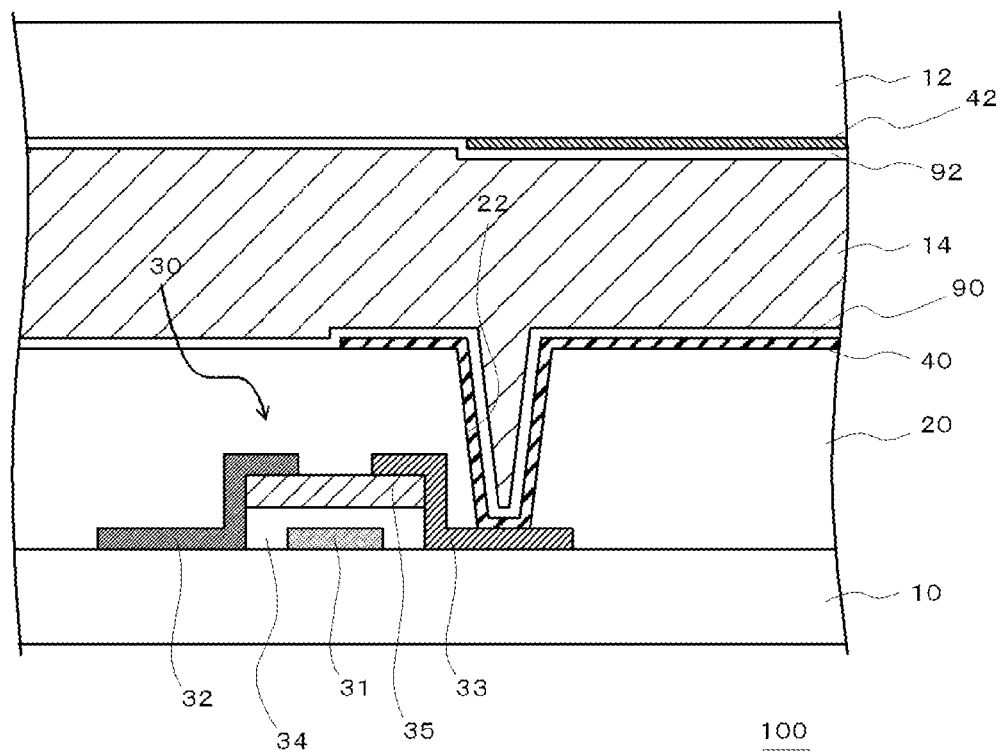

POLYMER, PHOTOSENSITIVE RESIN COMPOSITION AND ELECTRONIC DEVICE

This application claims priority under 35 U.S.C. §119 to U.S. Provisional Application Ser. No. 61/949,088, filed Mar. 6, 2014, and entitled "POLYMER AND PHOTOSENSITIVE RESIN COMPOSITION", the entire disclosure of which is incorporated herein by reference.

BACKGROUND

Technical Field

The invention relates to a polymer, a photosensitive resin composition, and an electronic device.

Related Art

As an insulating film comprising an electronic device, a resin film obtained by exposing a photosensitive resin composition is used. For example, as a technique for such a photosensitive resin composition, a technique disclosed in Japanese Unexamined Patent Publication No. H2-146045 can be referenced.

In Japanese Unexamined Patent Publication No. H2-146045, a photoresist composition including an alkali-soluble resin and a photosensitive agent is desired.

SUMMARY

In recent years, development of a new polymer which can improve the reliability of the materials used in a manufacturing process of an electronic device has been required.

In one embodiment, there is provided a polymer including a structural unit represented by the following Formula (1a), a structural unit represented by the following Formula (1b) and a structural unit represented by the following Formula (1c).

In addition, in another embodiment, there is provided a photosensitive resin composition used to form a permanent film including the above-described polymer and a photo active compound.

In addition, in another embodiment, there is provided an electronic device including a permanent film formed using the above-described photosensitive resin composition According to the invention, a new polymer which can improve the reliability of the materials used in a manufacturing process of an electronic device can be provided.

BRIEF DESCRIPTION OF THE DRAWING

The above and other objects, advantages and features of the present invention will be more apparent from the following description of certain preferred embodiments taken in conjunction with the accompanying drawing, in which:

FIG. 1 shows a cross-sectional diagram showing an example of an electronic device.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to a drawing. Moreover, in all the drawings, like elements are referenced by like reference numerals and descriptions thereof will not be repeated.

A polymer (a first polymer) according to the present embodiment includes a structural unit represented by the following Formula (1a), a structural unit represented by the following Formula (1b) and a structural unit represented by the following Formula (1c).

[Chemical formula 1]

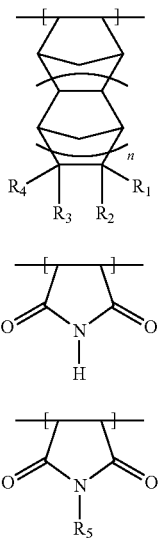

[Chemical formula 2]

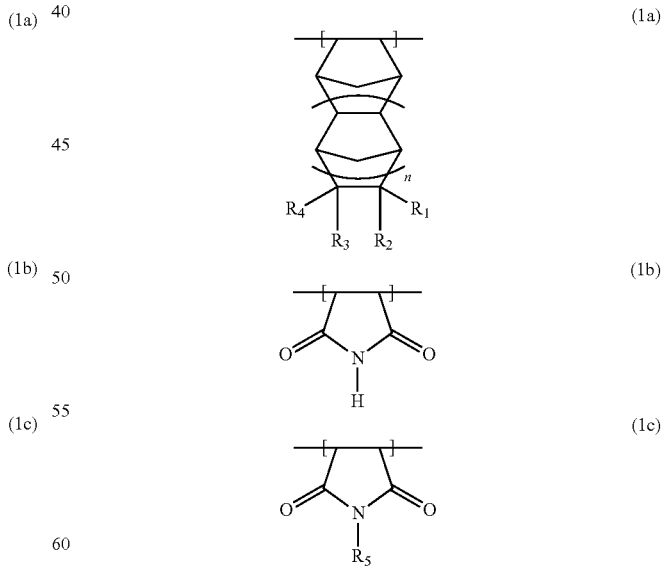

(In Formula (1a), n represents 0, 1 or 2. Each of $R_1$, $R_2$, $R_3$ and $R_4$ independently represents a hydrogen atom or an organic group having 1 to 10 carbon atoms. In Formula (1c), $R_5$ represents an organic group having 1 to 10 carbon atoms.)

(In Formula (1a), n represents 0, 1 or 2. Each of $R_1$, $R_2$, $R_3$ and $R_4$ independently represents a hydrogen atom or an organic group having 1 to 10 carbon atoms. In Formula (1c), $R_5$ represents an organic group having 1 to 10 carbon atoms.)

A process margin can be mentioned as a criterion to determine the reliability of the materials used in a manufacturing process of an electronic device. The process margin shows the tolerance with respect to misalignment resulting from various devices and processes, and, for example, an effect on a pattern dimension after a dwell time in a process from exposure to development is exemplified. In particular, in a case where since polymerizable groups are contained in the photosensitive resin composition for forming a permanent film such as an insulating interlayer, curing reaction proceeds due to catalytic action by acid or alkali present in the process during the dwell time, there is a concern that a problem in that residue remains occurs in case that rework is required. As a result, since these problems also affect the yield of the electronic device, development of a new polymer which is excellent in rework property, and can realize the photosensitive resin composition having a large process margin is required.

The present inventors performed thorough studies on a new polymer which can improve the rework property. As a result, the inventors newly developed the first polymer having a structural unit represented by the above Formula (1a), a structural unit represented by the above Formula (1b) and a structural unit represented by the above Formula (1c). Thus, according to the embodiment, a new polymer which can increase the process margin and improve the reliability in a manufacturing process of an electronic device can be provided.

Hereinafter, the first polymer, the photosensitive resin composition and the electronic device will be described in detail.

(First Polymer)

First, the first polymer will be described.

As described above, the first polymer according to the embodiment consists of a copolymer having a structural unit represented by the following Formula (1a), a structural unit represented by the following Formula (1b) and a structural unit represented by the following Formula (1c).

[Chemical formula 3]

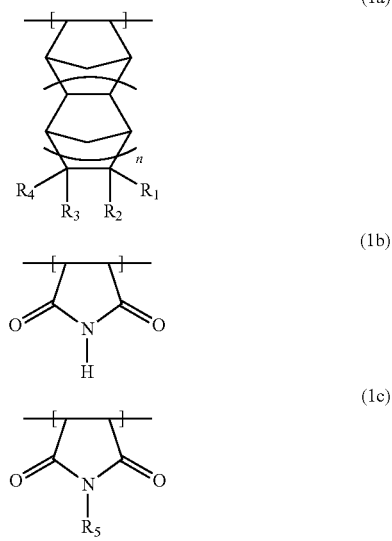

In the above Formula (1a), n represents 0, 1 or 2. Each of $R_1$, $R_2$, $R_3$ and $R_4$ independently represents a hydrogen atom or an organic group having 1 to 10 carbon atoms. In the above Formula (1c), $R_5$ represents an organic group having 1 to 10 carbon atoms. A molar ratio of the structural unit represented by the Formula (1a), which is not particularly limited, is preferably equal to or more than 10 and equal to or less than 90 with respect to the entire first polymer (100). A molar ratio of the structural unit represented by the Formula (1b), which is not particularly limited, is preferably equal to or more than 1 and equal to or less than 50 with respect to the entire first polymer (100). A molar ratio of the structural unit represented by the Formula (1c), which is not particularly limited, is preferably equal to or more than 1 and equal to or less than 50 with respect to the entire first polymer (100).

By using such a first polymer as the polymer comprising the photosensitive resin composition, it is possible to improve the rework characteristic while maintaining the characteristics required for the resin film such as heat resistance, transparency, low dielectric constant, low birefringence, chemical resistance and water repellency with regard to the resin film formed by using the photosensitive resin composition. It is supposed to be due to the fact that in addition to a structural unit derived from norbornene having an alicyclic skeleton, a structural unit derived from an N-substituted maleimide and a structural unit derived from a non-substituted maleimide are included in the first polymer.

Moreover, in the copolymer, in a case where a plurality of the structural units represented by the above Formula (1a) is present, each structure of each structural unit represented by the above Formula (1a) can be independently determined. This is the same with regard to each of the structural unit represented by the above Formula (1b) and the structural unit represented by the above Formula (1c).

Examples of the organic group having 1 to 10 carbon atoms constituting $R_1$, $R_2$, $R_3$ and $R_4$ include hydrocarbon groups having 1 to 10 carbon atoms such as an alkyl group, an alkenyl group, an alkynyl group, an alkylidene group, an aryl group, an aralkyl group, an alkaryl group or a cycloalkyl group, or an organic group having 1 to 10 carbon atoms including a carboxyl group or a glycidyl group. Examples of the alkyl group include a methyl group, an ethyl group, an n-propyl group, an isopropyl group, an n-butyl group, an isobutyl group, a sec-butyl group, a tert-butyl group, a pentyl group, a neopentyl group, a hexyl group, a heptyl group, an octyl group, a nonyl group and a decyl group. Examples of the alkenyl group include an allyl group, a pentenyl group and a vinyl group. Examples of the alkynyl group include an ethynyl group. Examples of the alkylidene group include a methylidyne group and an ethylidene group. Examples of the aryl group include a phenyl group and a naphthyl group. Examples of the aralkyl group include a benzyl group and a phenethyl group. Examples of the alkaryl group include a tolyl group and a xylyl group. Examples of the cycloalkyl group include an adamantyl group, a cyclopentyl group, a cyclohexyl group and a cyclooctyl group. Moreover, one or more hydrogen atoms of these alkyl group, alkenyl group, alkynyl group, alkylidene group, aryl group, aralkyl group, alkaryl group and cycloalkyl group are may be substituted with halogen atoms such as fluorine, chlorine, bromine or iodine.

As the organic group having 1 to 10 carbon atoms, including a glycidyl group, constituting $R_1$, $R_2$, $R_3$ and $R_4$, the organic group represented by the following Formula (6) is exemplified.

[Chemical formula 4]

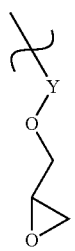

(6)

In the above Formula (6), Y represents a single bond or a divalent organic group having 1 to 7 carbon atoms. A divalent organic group constituting Y may have one or two or more of oxygen, nitrogen and silicon, and is a linear or branched divalent hydrocarbon group. In the embodiment, for example, Y can be an alkylene group having 1 to 7 carbon atoms. Moreover, one or more hydrogen atoms among the organic groups constituting Y may be substituted with halogen atoms such as fluorine, chlorine, bromine or iodine.

In the embodiment, for example, the above organic group including a glycidyl group is preferably the organic group represented by the following Formula (7). Thus, it is possible to further effectively improve the balance of the rework characteristic, stability over time and solvent resistance with respect to the resin film formed using the photosensitive resin composition including the first polymer.

[Chemical formula 5]

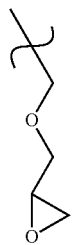

(7)

In addition, as the organic group having 1 to 10 carbon atoms, including a carboxyl group, constituting $R_1$, $R_2$, $R_3$ and $R_4$, the organic group represented by the following Formula (8) is exemplified.

[Chemical formula 6]

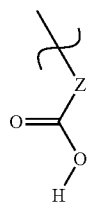

(8)

In the above Formula (8), Z represents a single bond or a divalent organic group having 1 to 9 carbon atoms. A divalent organic group constituting Z may have one or two or more of oxygen, nitrogen and silicon, and is a linear or branched divalent hydrocarbon group. In the embodiment, for example, Z can be a single bond or an alkylene group having 1 to 7 carbon atoms. Moreover, one or more hydrogen atoms among the organic groups constituting Z may be substituted with halogen atoms such as fluorine, chlorine, bromine or iodine.

In the embodiment, for example, the above organic group containing a carboxyl group is preferably the organic group represented by the following Formula (9). Thus, it is possible to further effectively improve the balance of the rework characteristic, stability over time and solvent resistance with respect to the resin film formed using the photosensitive resin composition including the first polymer.

[Chemical formula 7]

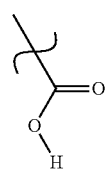

(9)

In the embodiment, at least one of $R_1$, $R_2$, $R_3$ and $R_4$ is preferably the organic group containing a carboxyl group or a glycidyl group. Thus, it is possible to improve the balance between the rework characteristic and solvent resistance with respect to the resin film formed using the photosensitive resin composition having the first polymer. In addition, it is possible to contribute to the improvement of the heat resistance and mechanical strength. In addition, from the viewpoint of further effectively improving the balance between the rework characteristic and solvent resistance, it is preferable that at least one of $R_1$, $R_2$, $R_3$ and $R_4$ be the organic group containing a carboxyl group or a glycidyl group, and the others be hydrogen atoms.

In the embodiment, a copolymer constituting the first polymer preferably includes a structural unit in which at least one of $R_1$, $R_2$, $R_3$ and $R_4$ is an organic group containing a glycidyl group as at least a part of a structural unit derived from norbornene. Thus, it is possible to further effectively improve the solvent resistance with respect to the resin film formed using the photosensitive resin composition having the first polymer. As such copolymers, copolymers represents by the following formula (11) are exemplified.

[Chemical formula 8]

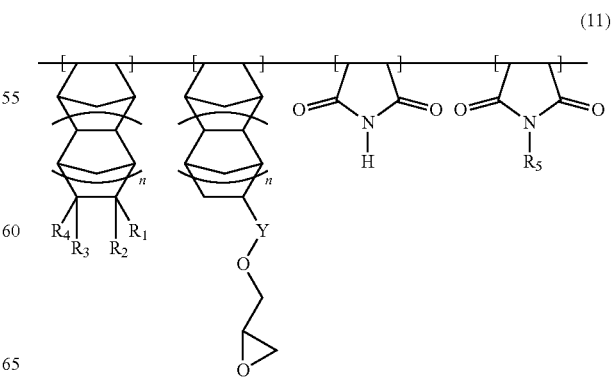

(11)

(In Formula (11), those exemplified by the above Formulas (1a) and (1c) can be applied to n, $R_1$, $R_2$, $R_3$ and $R_4$ and $R_5$. Those exemplified by the above Formula (6) can be applied to Y.)

Examples of the organic group having 1 to 10 carbon atoms constituting $R_5$ include hydrocarbon groups having 1 to 10 carbon atoms such as an alkyl group, an alkenyl group, an alkynyl group, an alkylidene group, an aryl group, an aralkyl group, an alkaryl group or a cycloalkyl group. Examples of the alkyl group include a methyl group, an ethyl group, an n-propyl group, an isopropyl group, an n-butyl group, an isobutyl group, a sec-butyl group, a tert-butyl group, a pentyl group, a neopentyl group, a hexyl group, a heptyl group, an octyl group, a nonyl group and a decyl group. Examples of the alkenyl group include an allyl group, a pentenyl group and a vinyl group. Examples of the alkynyl group include an ethynyl group. Examples of the alkylidene group include a methylidyne group and an ethylidene group. Examples of the aryl group include a phenyl group and a naphthyl group. Examples of the aralkyl group include a benzyl group and a phenethyl group. Examples of the alkaryl group include a tolyl group and a xylyl group. Examples of the cycloalkyl group include an adamantyl group, a cyclopentyl group, a cyclohexyl group and a cyclooctyl group. Moreover, one or more hydrogen atoms included in $R_5$ may be substituted with halogen atoms such as fluorine, chlorine, bromine or iodine.

Moreover, the copolymer constituting the first polymer, within a range which does not impair the effects of the invention, may include a structural unit other than the structural unit represented by the above Formula (1a), the structural unit represented by the above Formula (1b) and the structural unit represented by the above Formula (1c).

As the first polymer according to the embodiment, polymers shown below can be exemplified. Moreover, the first polymer is not limited to the following.

[Chemical formula 9]

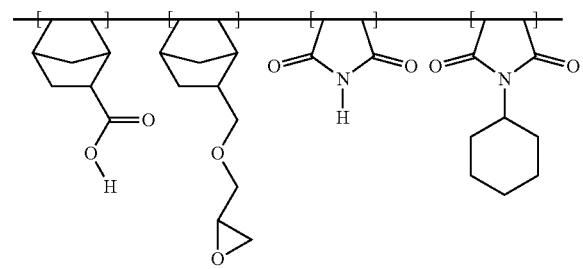

Moreover, the first polymer may include one kind or two or more kinds of a monomer represented by the following Formula (12), a monomer represented by the following Formula (13) and maleimide as a low molecular weight component.

[Chemical formula 10]

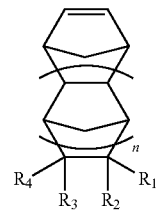

(12)

(In Formula (12), n, $R_1$, $R_2$, $R_3$ and $R_4$ can be those exemplified by the above Formula (1a).)

[Chemical formula 11]

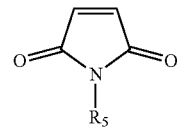

(13)

(In Formula (13), $R_5$ can be that exemplified by the above Formula (1c).)

The first polymer can be synthesized, for example, in the following manner.

(Polymerization Step (Treatment S1))

First, norbornene-type monomer represented by the above Formula (12), maleimide and N-substituted maleimide represented by the above Formula (13) are prepared as a monomer.

Next, the prepared monomer is subjected to addition polymerization to obtain a copolymer (Copolymer 1). Herein, for example, the addition polymerization is performed by radical polymerization. In the embodiment, after the above monomer and a polymerization initiator are dissolved in a solvent, solution polymerization can be performed by heating for a predetermined time. At this time, for example, heating temperature can be in the range of 50° C. to 80° C. In addition, for example, heating time can be in the range of 1 hour to 20 hours. Moreover, it is more preferable to perform the solution polymerization after dissolved oxygen in the solvent is removed by sparging with nitrogen.

As the solvent used in the solution polymerization, one kind or two or more kinds of methyl ethyl ketone (MEK), propylene glycol monomethyl ether, diethyl ether, tetrahydrofuran (THF) and toluene can be used. In addition, as the polymerization initiator, one kind or two or more kinds of an azo compound and an organic peroxide can be used. Examples of the azo compound include azobisisobutyronitrile (AIBN), dimethyl 2,2'-azobis(2-methylpropionate) and 1,1'-azobis(cyclohexanecarbonitrile) (ABCN). Examples of the organic peroxide include hydrogen peroxide, ditertiary butyl peroxide (DTBP), benzoyl peroxide (BPO) and methyl ethyl ketone peroxide (MEKP).

Moreover, for example, the structural unit represented by the above Formula (1c) can also be obtained by a method in which after maleic anhydride is subjected to addition polymerization with another monomer to synthesize a copolymer, a structural unit derived from maleic anhydride is ring-opened by amines to obtain maleamic acid, and the maleamic acid is subjected to an imide ring closure. For example, the imide ring closure is performed by heating in the presence of a catalyst such as tertiary amine.

(Purification Step (Treatment S2))

A reaction solution including the copolymer 1 obtained in the above manner is added to hexane or methanol to precipitate a polymer. Next, after the polymer is collected by filtration, it was washed with hexane or methanol, and it was dried. In the embodiment, for example, the first polymer can be synthesized in this way.

(Photosensitive Resin Composition)

The photosensitive resin composition is used to form a permanent film.

The permanent film is constituted with a resin film obtained by curing the photosensitive resin composition. In the embodiment, for example, after a coating film comprising with the photosensitive resin composition is subjected to patterning into a desired shape by exposure and development, the coating film is heat-treated to be cured, and as a result, a permanent film is formed.

Examples of the permanent film formed using the photosensitive resin composition include an interlayer film, a surface protecting film or a dam material. In addition, for example, the permanent film can also be used as an optical material such as an optical lens. Moreover, application of the permanent film is not limited thereto.

The interlayer film refers to an insulating film provided in a multilayer structure, and the type thereof is not particularly limited. Examples of the interlayer film include interlayer films used in semiconductor device applications such as an insulating interlayer constituting a multilayer interconnection structure of a semiconductor element, a build-up layer or a core layer constituting a circuit substrate. In addition, examples of the interlayer film also include interlayer films used in display device applications such as a planarization film covering a thin film transistor (TFT) in a display device, a liquid crystal orientation film, a projection provided on a color filter substrate of a multi domain vertical alignment (MVA)-type liquid crystal display device, or a partition wall for forming a cathode of an organic EL element.

The surface protecting film refers to an insulating film which is formed on a surface of an electronic component or an electronic device for protecting the surface, and the type thereof is not particularly limited. Examples of such a surface protecting film include a passivation film, a bump protecting film or a buffer coat layer provided on a semiconductor element, or a cover coat provided on a flexible substrate. In addition, the dam material is a spacer used to form a hollow portion for positioning an optical element on a substrate.

The photosensitive resin composition includes the first polymer and a photo active compound.

As the first polymer, those exemplified above can be used. The photosensitive resin composition according to the embodiment can include one kind or two or more kinds of the first polymer exemplified above. The content of the first polymer in the photosensitive resin composition, which is not particularly limited, is preferably equal to or greater than 20% by mass and equal to or less than 90% by mass, and more preferably equal to or greater than 30% by mass and equal to or less than 80% by mass with respect to the entire solid content of the photosensitive resin composition. Moreover, the solid content of the photosensitive resin composition refers to components excluding the solvent included in the photosensitive resin composition. Hereinafter, the same is applied in the present specification.

For example, the photosensitive resin composition can have a diazoquinone compound as the photo active compound which provides TMAH (Tetramethylammonium hydroxide) dissolution contrast in the film upon exposure to light. For example, the diazoquinone compound used as the photo active compound includes a compound exemplified below.

[Chemical formula 12]

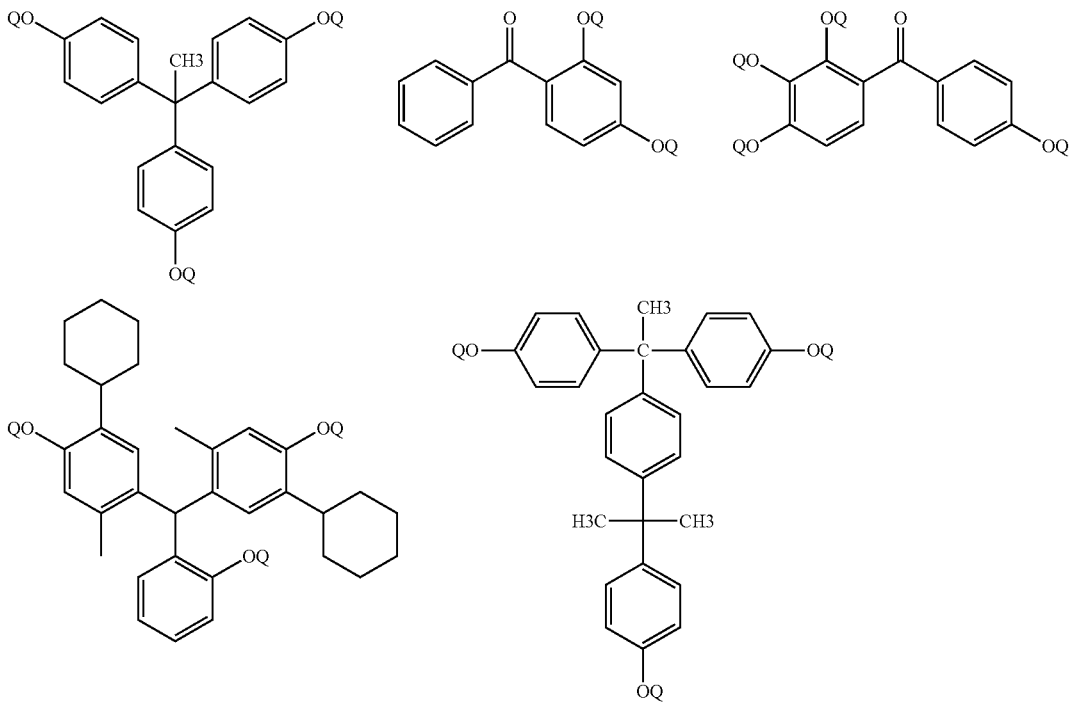

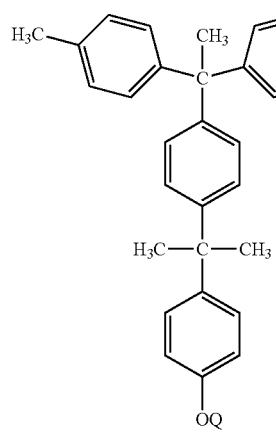
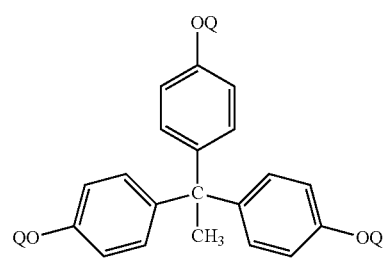
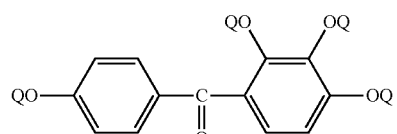
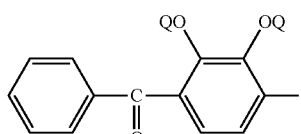
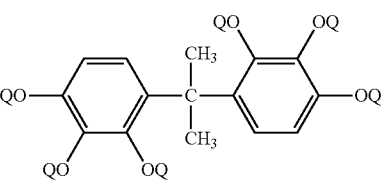
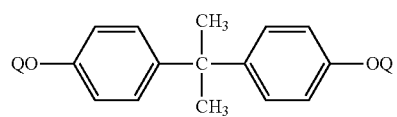
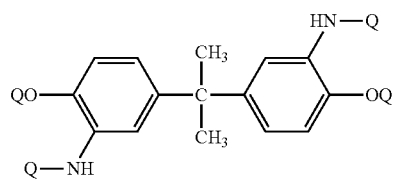
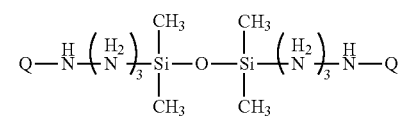
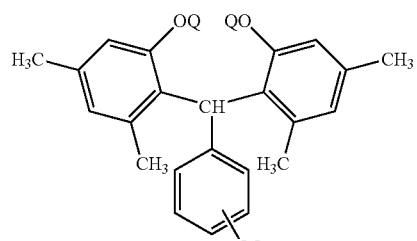
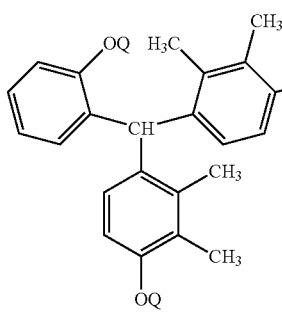
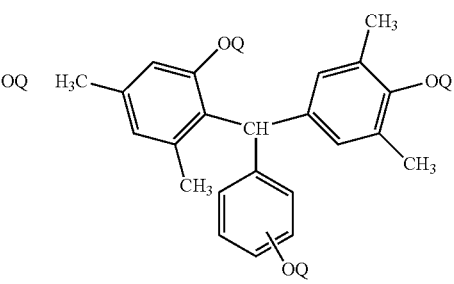
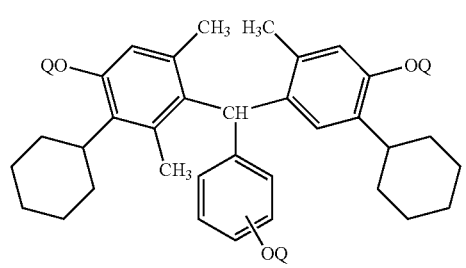
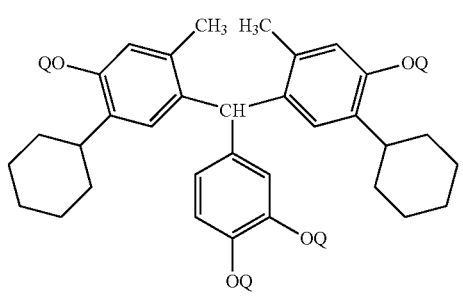

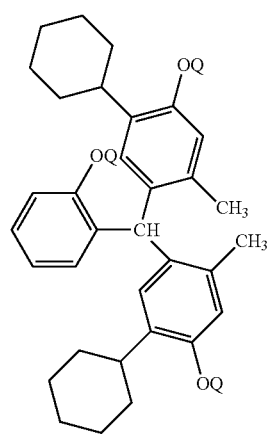
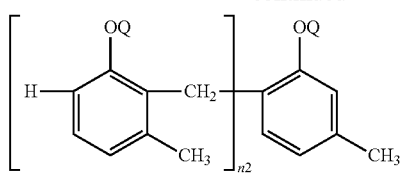
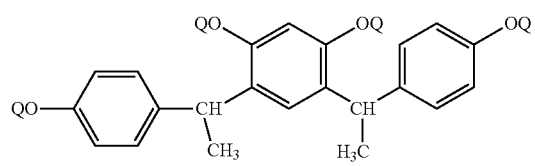
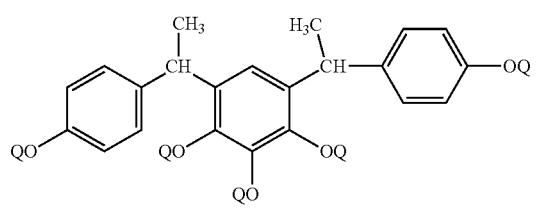
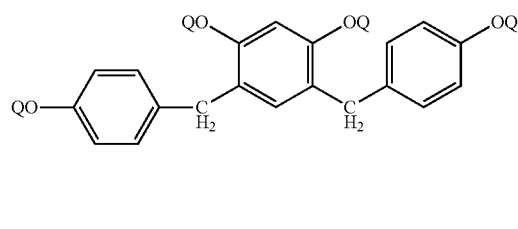
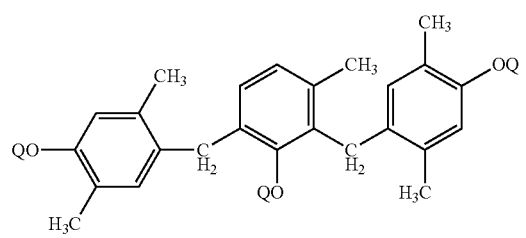
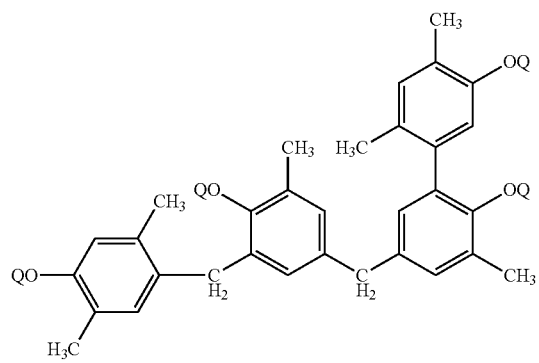
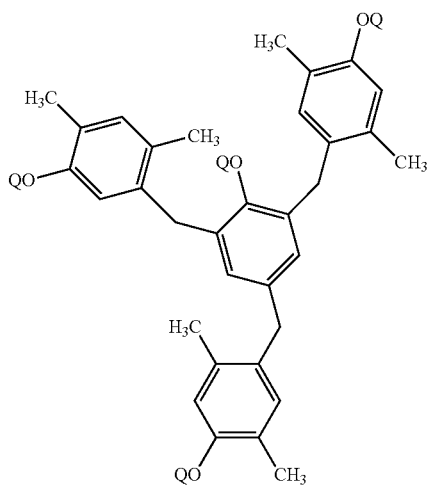

16
-continued
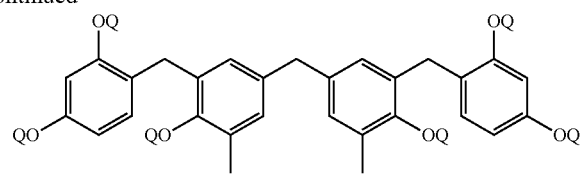
15
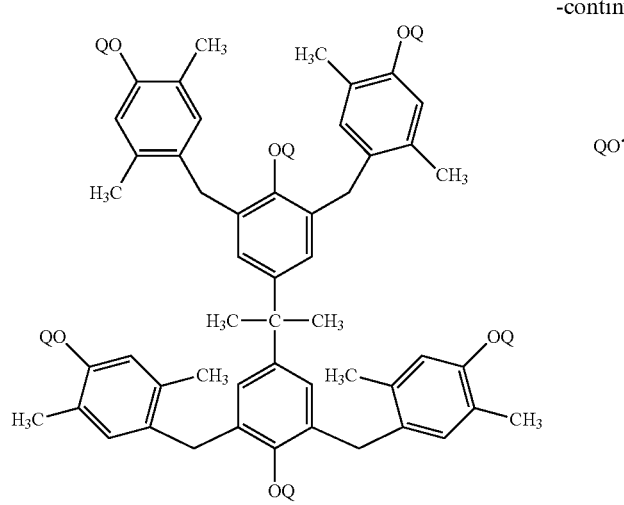
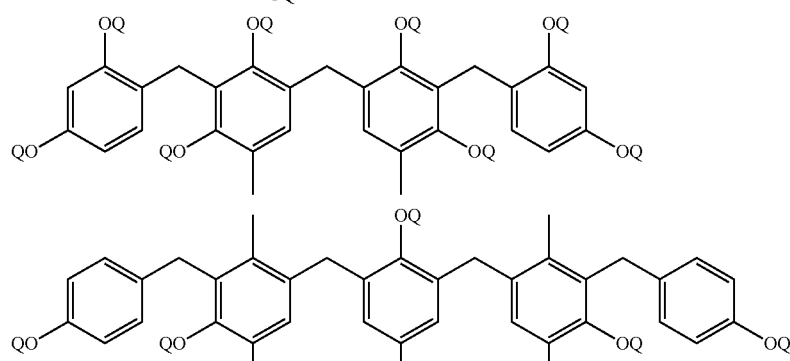
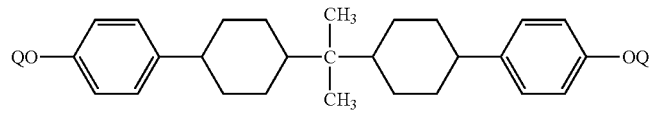
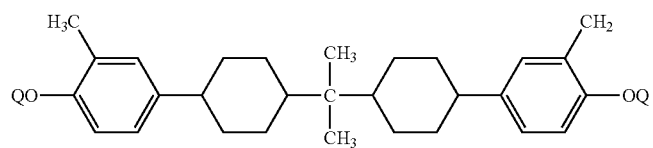
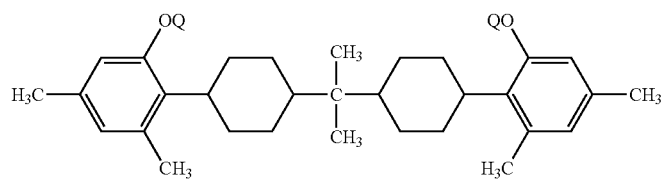
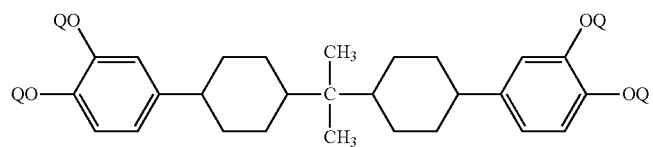
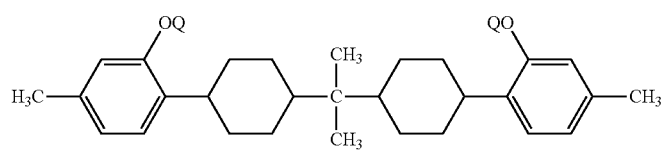

-continued

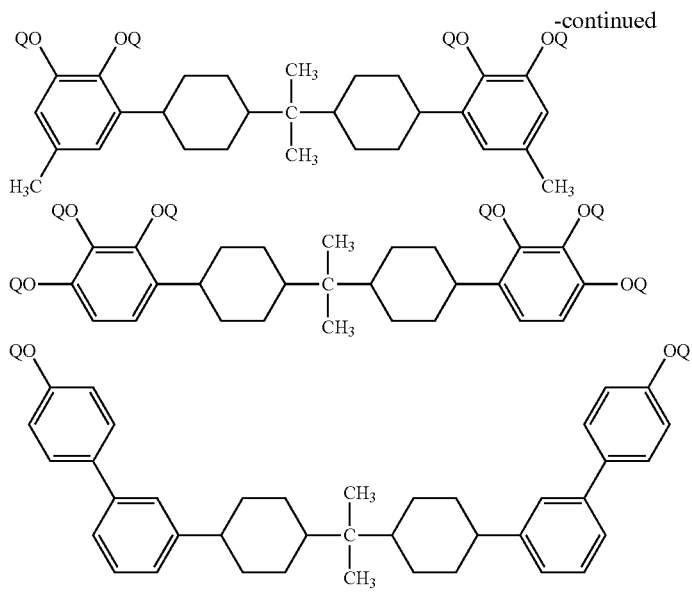

(n2 represents an integer of equal to or greater than 1 and equal to or less than 5.)

In each compound described above, Q represents any one of the structures (a), (b) and (c) shown below, or a hydrogen atom. However, at least one of Q included in each compound is any one of the structures (a), (b) and (c). From the viewpoint of a dielectric constant and a transparency of the photosensitive resin composition, o-naphthoquinone diazide sulfonic acid derivatives which have the structure (a) or (b) are more preferable.

[Chemical formula 13]

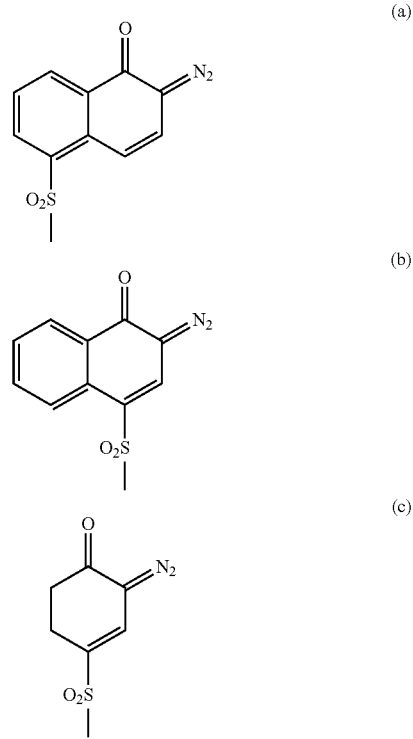

The content of the photo active compound in the photosensitive resin composition is preferably equal to or greater than 5% by mass and equal to or less than 40% by mass, and more preferably equal to or greater than 10% by mass and equal to or less than 30% by mass with respect to the entire solid content of the photosensitive resin composition.

In addition, the photosensitive resin composition may have sulfonium salts such as CPI-100P, 101A, 110B, 200K and 210S (here before, manufactured by San-Apro LTD.) as photoacid generating agents. The photosensitive resin composition according to the embodiment can also include one kind or two or more kinds of the photo-acid generating agent exemplified above.

For example, the photosensitive resin composition can have an acid generating agent (thermal acid generating agent) which generates acid by heat. The thermal acid generating agent can includes an aromatic sulfonium salt such as SI-45L, SI-60L, SI-80L, SI-100L, SI-110L, SI-150L (hereinbefore, manufactured by Sanshin Chemical Industry Co., Ltd.) as the acid generating agents (thermal acid generating agent) which generates acid by heat. Moreover, in the embodiment, the photo-acid generating agent exemplified hereinbefore and a thermal acid generating agent thereof can also be used in combination.

The content of the acid generating agent in the photosensitive resin composition is preferably equal to or greater than 0.1% by mass and equal to or less than 20% by mass, and more preferably equal to or greater than 0.5% by mass and equal to or less than 10% by mass with respect to the entire solid content of the photosensitive resin composition. Thus, it is possible to effectively improve the balance of the reactivity of the photosensitive resin composition, and the rework characteristic and developability of the resin film formed using the photosensitive resin composition.

The photosensitive resin composition may include an adhesive property improver. As the adhesive property improver, which is not particularly limited, silane coupling agents such as aminosilane, epoxysilane, acrylic silane, mercaptosilane, vinylsilane, ureidosilane or sulfidesilane can be used. These may be used alone as one type or may be used in a combination of two or more types. Among these, from the viewpoint of effectively improving the adhesive property with respect to other members, the epoxy silane is more preferably used.

Examples of the aminosilane include bis(2-hydroxyethyl)-3-aminopropyltriethoxysilane, γ-aminopropyltriethoxysilane, γ-aminopropyltrimethoxysilane, γ-aminopropylmethyldiethoxysilane, γ-aminopropylmethyldimethoxysilane, N-β(aminoethyl)γ-aminopropyltrimethoxysilane, N-β(aminoethyl)γ-aminopropyltriethoxysilane, N-β(aminoethyl)γ-aminopropylmethyldimethoxysilane, N-β(aminoethyl)γ-aminopropylmethyldiethoxysilane or N-phenyl-γ-aminopropyltrimethoxysilane. Examples of the epoxysilane includes γ-glycidoxypropyltrimethoxysilane, γ-glycidoxypropylmethyldiethoxysilane or β-(3,4epoxycyclohexyl)ethyltrimethoxysilane. Examples of the acrylic silane include γ-(methacryloxypropyl)trimethoxysilane, γ-(methacryloxypropyl)methyldimethoxysilane or γ-(methacryloxypropyl)methyldiethoxysilane. Examples of the mercaptosilane include γ-mercaptopropyltrimethoxysilane. Examples of the vinylsilane include vinyltris(μ-methoxyethoxy)silane, vinyltriethoxysilane or vinyltrimethoxysilane. Examples of the ureidosilane include 3-ureidopropyltriethoxysilane. Examples of the sulfidesilane include bis(3-(triethoxysilyl)propyl)disulfide or bis(3-(triethoxysilyl)propyl)tetrasulfide.

The content of the adhesive property improver in the photosensitive resin composition is preferably equal to or greater than 1% by mass and equal to or less than 10% by mass, and more preferably equal to or greater than 2% by mass and equal to or less than 8% by mass with respect to the entire solid content of the photosensitive resin composition. Thus, it is possible to further effectively improve the adhesive property with respect to other members of the resin film formed using the photosensitive resin composition.

The photosensitive resin composition may include a surfactant. For example, the surfactant includes a compound including a fluorine group (for example, a fluorinated alkyl group) or a silanol group, or a compound having a siloxane bond as a main skeleton. As a surfactant in the embodiment, surfactants including a fluorine-based surfactant or a silicone-based surfactant are particularly preferable. Examples of the surfactant include a Megaface F557 manufactured by DIC Corporation and the like, and the surfactant is not limited thereto.

The content of the surfactant in the photosensitive resin composition is preferably equal to or greater than 0.1% by mass and equal to or less than 3% by mass, and more preferably equal to or greater than 0.2% by mass and equal to or less than 2% by mass with respect to the entire solid content of the photosensitive resin composition. Thus, it is possible to effectively improve flatness of the photosensitive resin composition. In addition, when performing a spin coating, it is possible to more reliably prevent radial striations from occurring on the coating film.

In the photosensitive resin composition, additives such as a crosslinking agent, an antioxidant, a filler or a sensitizer may be added as necessary. For example, the crosslinking agent has a reactive group forming a crosslinked structure by a reaction with a carboxyl group in the first polymer. For example, as the reactive group, a cyclic ether group is preferable, and a glycidyl group or an oxetane group is particularly preferable. For example, the antioxidant can include one kind or two or more kinds selected from a group of a phenolic antioxidant, a phosphorus-based antioxidant and a thioether-based antioxidant. For example, the filler can include one kind or two or more kinds selected from an inorganic filler such as silica. For example, the sensitizer can includes one kind or two or more kinds selected from a group of anthracenes, xanthones, anthraquinones, phenanthrenes, chrysenes, benzopyrenes, fluoracenes, rubrenes, pyrenes, indanthrenes and thioxanthen-9-ones.

The photosensitive resin composition may include a solvent. In this case, the photosensitive resin composition enters a varnish state. For example, the solvent can include one kind or two or more kinds of propylene glycol monomethyl ether (PGME), propylene glycol monomethyl ether acetate (PGMEA), ethyl lactate, methylisobutyl carbinol (MIBC), gamma-butyrolactone (GBL), N-methylpyrrolidone (NMP), methyl n-amyl ketone (MAK), diethylene glycol monomethyl ether, diethylene glycol dimethyl ether, and diethylene glycol methylethyl ether. Moreover, the solvent capable of being used in the embodiment is not limited thereto.

(Electronic Device)

Next, an electronic device 100 according the embodiment will be described below.

For example, the electronic device 100 is provided with an insulating film 20 which is a permanent film formed using the photosensitive resin composition described above. The electronic device 100 according to the embodiment is not particularly limited as long as it is provided with an insulating film formed using the photosensitive resin composition. A display device having an insulating film 20 as a planarization film or a microlens, and a semiconductor device provided with a multilayer interconnection structure in which the insulating film 20 is used as an insulating interlayer are exemplified.

FIG. 1 shows a cross-sectional diagram showing an example of the electronic device 100.

In FIG. 1, the electronic device 100 is a liquid crystal display device, and a case where the insulating film 20 is used as the planarizing film is exemplified. For example, the electronic device 100 shown in FIG. 1 is provided with a substrate 10, a transistor 30 provided on the substrate 10, the insulating film 20 provided on the substrate 10 so as to cover the transistor 30, and an interconnection 40 provided on the insulating film 20.

For example, the substrate 10 is a glass substrate. For example, the transistor 30 is a thin film transistor constituting a switching element of a liquid crystal display device. For example, a plurality of the transistors 30 is arranged on the substrate 10 in an array pattern. For example, the transistor 30 shown in FIG. 1 is constituted with a gate electrode 31, a source electrode 32, a drain electrode 33, a gate insulating film 34 and a semiconductor layer 35. For example, the gate electrode 31 is provided on the substrate 10. The gate insulating film 34 is provided on the substrate 10 so as to cover the gate electrode 31. The semiconductor layer 35 is provided on the gate insulating film 34. In addition, for example, the semiconductor layer 35 is a silicon layer. The source electrode 32 is provided on the substrate 10 so as to come partly into contact with the semiconductor layer 35. The drain electrode 33 is provided on the substrate 10 so as to be away from the source electrode 32, and come partly into contact with the semiconductor layer 35.

The insulating film 20 functions as a planarization film for eliminating a difference in level due to the transistor 30 or the like, and for forming a flat surface on the substrate 10. The insulating film 20 is constituted with a cured product of the photosensitive resin composition described above. An opening 22 that penetrates the insulating film 20 so as to connect to the drain electrode 33 is provided in the insulating film 20.

An interconnection 40 that connects to the drain electrode 33 is formed on the insulating film 20 and in the opening 22.

The interconnection 40 functions as a pixel electrode constituting a pixel with a liquid crystal.

In addition, an orientation film 90 is provided on the insulating film 20 so as to cover the interconnection 40.

A counter substrate 12 is disposed over one surface provided with the transistor 30 of the substrate 10 so as to face the substrate 10. An interconnection 42 is provided on one surface facing the substrate 10 of the counter substrate 12. The interconnection 42 is provided at a position facing the interconnection 40. In addition, an orientation film 92 is provided on the one surface of the counter substrate 12 so as to cover the interconnection 42.

A liquid crystal constituting a liquid crystal layer 14 is filled in between the substrate 10 and the counter substrate 12, For example, the electronic device 100 shown in FIG. 1 can be formed in the following manner.

First, the transistor 30 is formed on the substrate 10. Next, the photosensitive resin composition is coated on one surface provided on the transistor 30 of the substrate 10 by a printing method or a spin coating method to form the insulating film 20 covering the transistor 30. Next, the insulating film 20 is exposed to ultraviolet rays or the like, and developed, thereby patterning the insulating film 20. Thus, the opening 22 is formed in a part of the insulating film 20. Next, the insulating film 20 is subjected to heating and curing. Thus, the insulating film 20 which is a planarization film is formed on the substrate 10.

Next, the interconnection 40 that is connected to the drain electrode 33 is formed in the opening 22 of the insulating film 20. Thereafter, the counter substrate 12 is disposed on the insulating film 20, and a liquid crystal is filled in between the counter substrate 12 and the insulating film 20, thereby forming the liquid crystal layer 14.

Thus, the electronic device 100 shown in FIG. 1 is formed.

Moreover, the invention is not limited to the embodiments described above, and modification, improvement and the like in a range of achieving the object of the invention are included in the invention.

EXAMPLES

Next, the examples of the invention will be described.

Synthesis of Polymer

Synthesis Example 1

Methylglycidylether norbornene (7.2 g, 40 mmol), norbornene carboxylic acid (1.3 g, 10 mmol), maleimide (2.9 g, 30 mmol), and N-cyclohexyl maleimide (3.6 g, 20 mmol) were weighed and added into a reaction vessel provided with a stirrer and a cooling tube. Furthermore, V-601 (0.46 g, 2 mmol) and 12.5 g of THF were added into the reaction vessel, and the resultant was stirred and dissolved. Next, after dissolved oxygen in the system was removed by sparging with nitrogen, the reaction was performed for 5 hours while maintaining the temperature at 60° C. in a nitrogen atmosphere. Next, the reaction mixture was cooled to room temperature, and it was diluted by adding 22 g of THF thereto. The diluted solution was poured into a large amount of methanol to precipitate a polymer. Next, the polymer was collected by filtration, further washed with methanol, and vacuum-dried at 30° C. for 16 hours. The obtained amount of the polymer was 7.0 g, and the yield was 47%. The weight average molecular weight of the obtained polymer was 7,100, and the dispersity was 1.37. In addition, the polymer had a structure represented by the following Formula (18).

[Chemical formula 14]

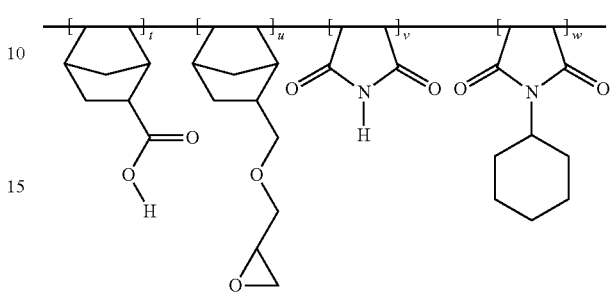

(18)

Preparation of Photosensitive Resin Composition

Example 1

10.0 g of a polymer synthesized by Synthesis Example 1, 3.0 g of an esterification product (PA-15 manufactured by Daito Chemix Corporation) of 4,4'-(1-{4-[1-(4-hydroxyphenyl)-1-methylethyl]phenyl}ethylidene)bisphenol and 1,2-naphthoquinonediazide-5-sulfonyl chloride, 0.4 g of 1-naphthylmethyl methyl-p-hydroxyphenyl sulfonium hexafluoroantimonate (SI-60L manufactured by Sanshin Chemical Industry Co., Ltd.), 0.5 g of KBM-403 (manufactured by Shin-Etsu Silicones Co., Ltd.) for improving adhesive property, and 0.1 g of F-557 (manufactured by DIC Corporation) for preventing radial striation which may occur on a resist film when performing a spin coating were dissolved so as to have a solid content of 20% in a mixed solvent in which ethyl lactate and diethylene glycol methyl ethyl ether were mixed at a ratio of 70:30. Filtration was performed on the resultant through a PTFE filter having a pore size of 0.2 μm, thereby preparing a photosensitive resin composition.

(Rework Characteristic)

The rework characteristic of the photosensitive resin composition in Example 1 was measured in the following manner.

First, the photosensitive resin composition was spin-coated (revolution speed: 500 rpm to 2,500 rpm) on a 1737 glass substrate manufactured by Corning Inc. having sizes of a horizontal width of 100 mm and a vertical width of 100 mm, and the resultant was pre-baked at 100° C. for 120 seconds using a hotplate, thereby obtaining a resin film having a thickness of about 3.0 μm. Next, using a mask having a mask pattern with a width of 5 μm, the resin film was exposed to g+h+i rays such that an accumulated amount of light is 300 mJ/cm² by a g+h+i ray mask aligner (PLA-501F (ultrahigh-pressure mercury lamp) manufactured by Canon Inc.). Thereafter, the resultant film was subjected to a developing treatment with a tetramethyl ammonium hydroxide aqueous solution of 0.5% for 90 seconds, and further rinsed with pure water, thereby obtaining a thin film with patterns. A bleaching treatment was performed on the thin film such that an accumulated amount of light is 300 mJ/cm² without using a mask. Next, after the resin film was left to stand for 24 hours in a yellow room (HEPA filter was used) which was maintained at a temperature of 23±1° C.

and a humidity of 40±5%, the bleaching treatment was further performed on the resin film such that an accumulated amount of light of the g+h+i rays is 300 mJ/cm² without using a mask. Next, the resin film was immersed in a 2.38% TMAH (tetramethyl ammonium hydroxide) solution of 23±1° C. for 120 seconds. At this time, the presence or absence of a residue of the resin film on the substrate was observed using a microscope.

In Example 1, the residue of the resin film was not observed.

It is apparent that the present invention is not limited to the above embodiment, and may be modified and changed without departing from the scope and spirit of the invention.

What is claimed is:

1. A polymer comprising:
   a structural unit represented by the following Formula (1a);
   a structural unit represented by the following Formula (1b); and
   a structural unit represented by the following Formula (1c),

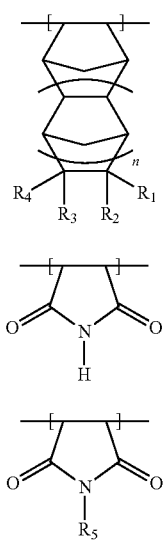

wherein in Formula (1a), n represents 0, 1 or 2, each of $R_1$, $R_2$, $R_3$ and $R_4$ independently represents a hydrogen atom or an organic group having 1 to 10 carbon atoms, and at least one of $R_1$, $R_2$, $R_3$ and $R_4$ is an organic group containing a glycidyl group, and in Formula (1c), $R_5$ represents an organic group having 1 to 10 carbon atoms.

2. A photosensitive resin composition used to form a permanent film comprising:
   the polymer according to claim 1; and
   a photo active compound.

3. An electronic device comprising a permanent film formed using the photosensitive resin composition according to claim 2.

4. The polymer according to claim 1,
   wherein the organic group containing a glycidyl group is an organic group represented by the following Formula (6),

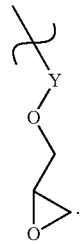

wherein in Formula (6), Y represents a single bond or a divalent organic group having 1 to 7 carbon atoms.

5. The polymer according to claim 1,
   wherein the organic group containing a glycidyl group is an organic group represented by the following Formula (7)

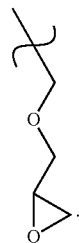

6. The polymer according to claim 1,
   wherein a copolymer constituting the polymer is a copolymer represented by the following formula (11),

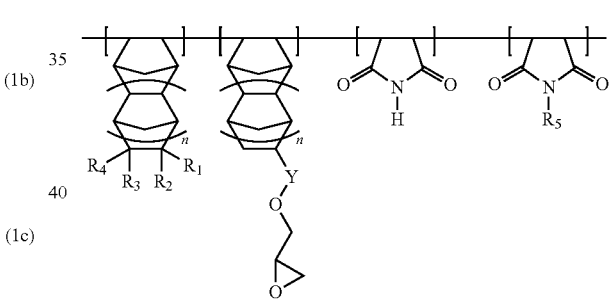

wherein in Formula (11), n represents 0, 1 or 2, at least one of $R_1$, $R_2$, $R_3$ and $R_4$ is an having 1 to 10 carbon atoms containing a carboxyl group, and the others are hydrogen atoms, Y represents a single bond or a divalent organic group having 1 to 7 carbon atoms.

7. The polymer according to claim 6,
   wherein the organic group containing a carboxyl group is an organic group represented by the following Formula (8)

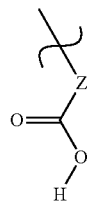

and wherein in Formula (8), Z represents a single bond or a divalent organic group having 1 to 9 carbon atoms.

8. The polymer according to claim 6,
wherein the organic group represented by the following Formula (9)

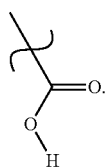
(9)

9. The polymer according to claim 1,
wherein a molar ratio of the structural unit represented by the Formula (1a) is equal to or more than 10 and equal to or less than 90, a molar ratio of the structural unit represented by the Formula (1b) is equal to or more than 1 and equal to or less than 50, a molar ratio of the structural unit represented by the Formula (1c) is equal to or more than 1 and to or less than 50 with respect to the entire polymer.

* * * * *